US 8,535,966 B2

(12) United States Patent
Anderson et al.

(10) Patent No.: US 8,535,966 B2
(45) Date of Patent: Sep. 17, 2013

(54) HORIZONTAL COPLANAR SWITCHES AND METHODS OF MANUFACTURE

(75) Inventors: Felix P. Anderson, Colchester, VT (US); Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 12/844,299

(22) Filed: Jul. 27, 2010

(65) Prior Publication Data
US 2012/0025331 A1 Feb. 2, 2012

(51) Int. Cl.
*H01L 21/00* (2006.01)

(52) U.S. Cl.
USPC ........ 438/51; 438/48; 257/415; 257/E21.582; 257/E21.641

(58) Field of Classification Search
USPC ................................ 438/48, 50–51; 257/415
See application file for complete search history.

(56) References Cited

U.S. PATENT DOCUMENTS

| | | | |
|---|---|---|---|
| 6,396,368 B1 | 5/2002 | Chow et al. | |
| 6,750,078 B2 | 6/2004 | Ma | |
| 6,798,029 B2 | 9/2004 | Volant et al. | |
| 7,202,764 B2 | 4/2007 | Deligianni et al. | |
| 7,514,760 B1* | 4/2009 | Quevy | 257/416 |
| 7,566,939 B2 | 7/2009 | Despont et al. | |
| 2002/0055260 A1* | 5/2002 | Chow et al. | 438/689 |
| 2005/0142888 A1* | 6/2005 | Ebuchi et al. | 438/738 |
| 2006/0267109 A1* | 11/2006 | Ohguro | 257/396 |
| 2006/0292729 A1* | 12/2006 | Ohguro | 438/48 |
| 2007/0108540 A1 | 5/2007 | Cuxart | |
| 2008/0217149 A1 | 9/2008 | Schmid et al. | |
| 2008/0308919 A1* | 12/2008 | Obata et al. | 257/678 |
| 2009/0071807 A1 | 3/2009 | Kominato et al. | |
| 2009/0267166 A1* | 10/2009 | Verheijden et al. | 257/415 |
| 2011/0049649 A1* | 3/2011 | Anderson et al. | 257/415 |
| 2011/0057288 A1* | 3/2011 | Tan et al. | 257/503 |
| 2012/0098136 A1* | 4/2012 | Lindgren et al. | 257/770 |

OTHER PUBLICATIONS

"Fabrication of MEMS Switch Device . . . Gap Area", IP.com Prior Art Database, Aug. 22, 2005, pp. 1-2 (Author: IBM).

* cited by examiner

*Primary Examiner* — A. Sefer
(74) *Attorney, Agent, or Firm* — Anthony Canale; Roberts Mlotkowski Safran & Cole, P.C.

(57) ABSTRACT

A MEMS structure and methods of manufacture. The method includes forming a sacrificial metal layer at a same level as a wiring layer, in a first dielectric material. The method further includes forming a metal switch at a same level as another wiring layer, in a second dielectric material. The method further includes providing at least one vent to expose the sacrificial metal layer. The method further includes removing the sacrificial metal layer to form a planar cavity, suspending the metal switch. The method further includes capping the at least one vent to hermetically seal the planar cavity.

18 Claims, 14 Drawing Sheets

HORIZONTAL COPLANAR SWITCHES AND METHODS OF MANUFACTURE

FIELD OF THE INVENTION

The invention relates to a semiconductor structures and methods of manufacture and, more particularly, to horizontal coplanar switches and methods of manufacture.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e., resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Depending on the particular application and engineering criteria, MEMS structures can come in many different forms. For example, MEMS can be realized in the form of a cantilever beam structure. In the cantilever structure, a cantilever arm (suspended electrode with one end fixed) is pulled toward a fixed electrode by application of an actuation voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness. Alternatively, the MEMS beam could be a bridge structure, where both ends are fixed.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

For example, in MEMS cantilever type switches the fixed electrodes and suspended electrode are typically manufactured using a series of conventional photolithographic, etching and deposition processes. In one example, after the suspended electrode is formed, a layer of sacrificial material, e.g., the spin-on polymer PMGI made by Microchem, Inc., is deposited under the MEMS structure, to form a cavity, and over the MEMS structure to form a cavity. The cavity over the MEM is used to support the formation of a cap, e.g., SiN dome, to seal the MEMS structure. However, this poses several shortcomings. For example, it is known that MEMS cavities formed with spin-on polymers such as PMGI, are non-planar. Non-planar MEMS cavities, though, introduce issues including, for example, lithographic depth of focus variability and packaging reliability due to dielectric cracking. In addition, MEMS cavities formed with spin-on polymers require processing at low temperatures, to avoid reflowing or damaging the polymer; and the polymer can leave organic (i.e., carbon containing) residues in the cavity post venting. Also, many additional processing steps are required, which is time consuming and costly.

Accordingly, there exists a need in the art to overcome the deficiencies and limitations described hereinabove.

SUMMARY

In a first aspect of the invention, a method comprises forming a sacrificial metal layer at a same level as a wiring layer, in a first dielectric material. The method further comprises forming a metal switch at a same level as another wiring layer, in a second dielectric material. The method further comprises providing at least one vent to expose the sacrificial metal layer. The method further comprises removing the sacrificial metal layer to form a planar cavity, suspending the metal switch. The method further comprises capping the at least one vent to hermetically seal the planar cavity.

In another aspect of the invention, a method comprises forming a sacrificial copper based layer and a copper based wiring layer during a same processing, in a first dielectric material. The method further comprises forming a metal stack switch and another wiring layer composed of the same materials as the metal stack switch during a same processing, in an upper dielectric material. The method further comprises providing a dual damascene trench and depositing an upper sacrificial copper based layer in a same level as a further wiring layer, and composed of the same materials and deposited at a same processing. The method further comprises forming at least one vent to expose the upper sacrificial metal layer. The method further comprises removing the upper sacrificial metal layer and the sacrificial metal layer to form an upper planar cavity and a lower planar cavity, which exposing the metal switch. The method further comprises capping the at least one vent to hermetically seal the upper planar cavity and the lower planar cavity.

In yet another aspect of the invention, a structure comprises a lower planar cavity on a same level as a copper based wiring layer. The structure further comprises an upper planar cavity, extending to the lower planar cavity, on a same level as another copper based wiring layer. The structure further comprises a metal switch suspended between the lower planar cavity and the upper planar cavity. The structure further comprises: a contact above the metal switch; a contact below the metal switch; or an actuator at a same level as the metal switch.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MEMS structure (MEMS), which comprises the structures of the present invention. In still further embodiments, a method in a computer-aided design system is provided for generating a functional design model of the MEMS. The method comprises generating a functional representation of the structural elements of the MEMS.

In another aspect of the invention, a method in a computer-aided design system for generating a functional design model of a switch is provided. The method comprises: generating a functional representation of a lower planar cavity on a same level as a copper based wiring layer; generating a functional representation of an upper planar cavity, extending to the lower planar cavity, on a same level as another copper based wiring layer; generating a functional representation of a metal switch suspended between the lower planar cavity and the upper planar cavity; and, one of: generating a functional representation of a contact above the metal switch; generating a functional representation of a contact below the metal switch; and generating a functional representation of an actuator at a same level as the metal switch.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to horizontal coplanar switches and methods of manufacture. In embodiments, the horizontal coplanar switches are horizontal MEMS switches. In embodiments, the MEMS switches use copper as the sacrificial material, combined with non-sacrificial copper wiring. As such and advantageously, the present invention utilizes existing wiring levels for switches which, in turn, eliminates additional processing levels.

Figure 1:
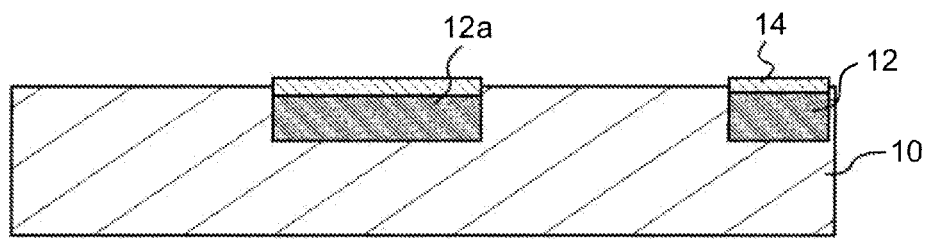
FIGS. 1-11 show structures and respective processing steps in accordance with aspects of the invention.

FIGS. 1-11 show structures and respective processing steps in accordance with aspects of the invention. More specifically, FIG. 1 shows a beginning structure at any desired level of a semiconductor device. The beginning structure includes a dielectric material 10. The dielectric material 10 may be, for example, $SiO_2$, FSG, SiCOH or other known dielectric materials. In embodiments, the dielectric material 10 is patterned using conventional lithographic and etching processes, such as, for example, reactive ion etching. This patterning forms trenches which can be filled with a copper damascene wiring 12, 12a. In embodiments, the wiring 12, 12a can be formed by electroplating. The wiring 12 can be, for example, about 1 micron tall and about 0.5 to 100 microns wide.

In an optional embodiment, a cap layer 14 is formed over the wiring 12, 12a. The cap layer 14 may be, for example, SiN, and may be formed by conventional chemical vapor deposition processes. The cap layer 14 can be about 25 nm in thickness; although other dimensions are also contemplated by the present invention. The cap layer 14 is deposited and patterned to be in direct contact with the wiring 12 and 12a. In embodiments, the cap layer 14 provides protection for the wiring 12 and 12a during subsequent processing steps.

Figure 2:
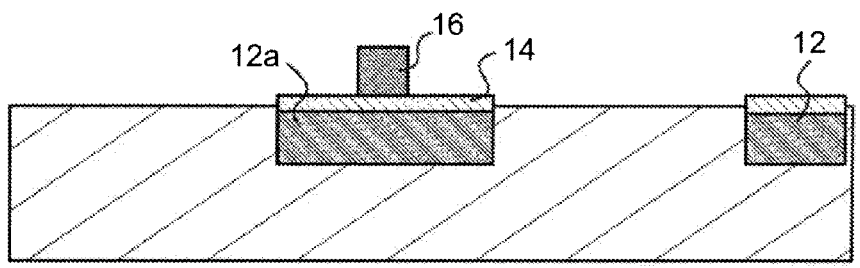

In FIG. 2, a metal layer is formed on the structure to form a contact 16. In embodiments, the metal layer can be a post Pt metal or other noble or refractory metal that does not alloy with the underlying copper wiring 12a. In embodiments, the contact 16 is formed using conventional deposition, lithographic and etching processes to form the contact 16 directly in contact with the wiring 12a.

Figure 3:
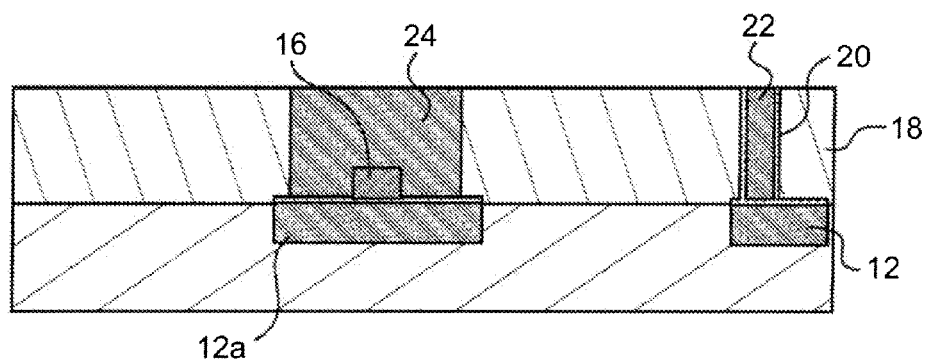

In FIG. 3, a dielectric layer 18 is deposited on the structure, including over the contact 16 and cap layer 14 or wirings 12 and 12a. In lithographic and etching processes, a via is opened to the wiring 12, and a liner 20 is deposited therein. The liner 20 can be, for example, a nitride material. In embodiments, the liner 20 may be about 40 nm; although other dimensions are also contemplated by the present invention. A metal (e.g., copper) is deposited over the liner 20, within the via, to form a contact or wiring 22. The metal deposition may begin with a copper seed layer and then a deposition or electroplating process, to fill the via.

A lithographic and etching process is used to open a via over the wiring 12a (over the cap layer 14 and contact 16). A metal 24 (e.g., copper) is deposited within the via. The metal deposition may begin with a copper seed layer and then a deposition or electroplating process, to fill the via. Advantageously, the metal 22 and metal 24 may be deposited at the same time. Alternatively, the via over the wiring 12a (over the cap layer 14 and contact 16) may be formed prior to the via over the wiring 12. After the formation of the metal 22 and 24, the structure can undergo a polishing process such as, for example, a chemical mechanical polishing (CMP). In embodiments, the metal 24 is a sacrificial wiring layer, which is removed in later processing steps.

Figure 4:
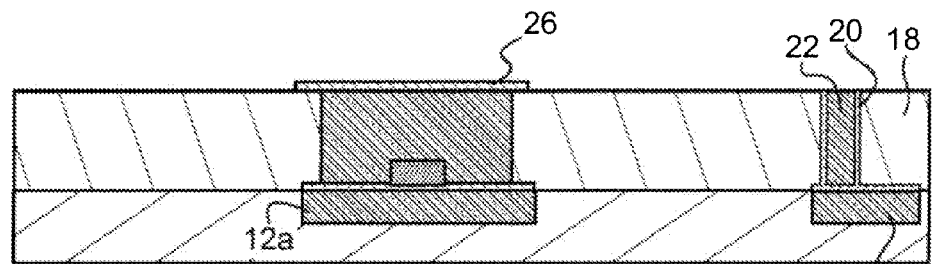

In FIG. 4, a metal 26 is formed over the metal 24. In embodiments, the metal 26 can be formed, for example, by sputtering or deposition processes. The metal 26 may be, for example, W, Ge, or Si, or any other material that is removed in subsequent etching processes using, for example, $XeF_2$. The metal 26 is patterned and etched away, except for over the metal 24 (which will form the switch of the MEMS switch).

Figure 5:
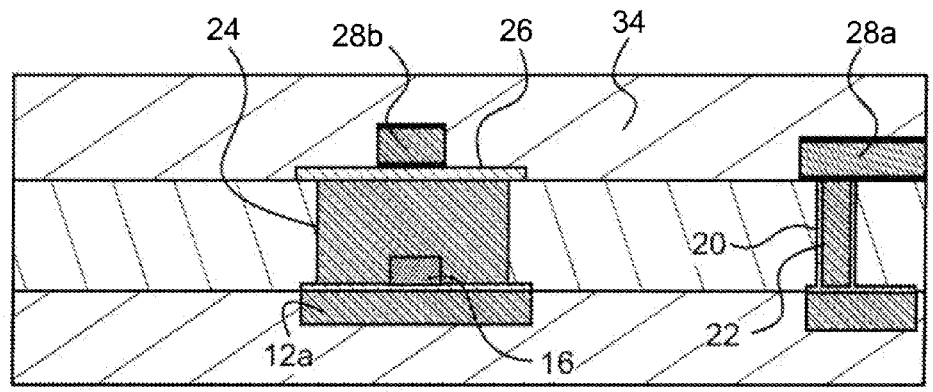

In FIG. 5, wiring or contact structures 28a and 28b are formed on the structure using conventional deposition and etching processes. The wiring or contact structures 28a and 28b can be formed using, for example, a Ti/TiN/Al Cu/TiN stack, by deposition processes known to those of skill in the art. Advantageously, the wiring or contact structures 28a and 28b may be deposited (formed) at the same time. In embodiments, the wiring or contact structures 28a and 28b can include a gold upper layer for improved contact. The stack can then be etched away to remain in contact with the metal 26 and the wiring 22. In embodiments, a subtractive etch of the wiring can be used, in which the etch chemistry does not corrode Cu. The wiring or contact structure 28b will be a lever or arm of the contact switch.

A dielectric layer 34 is deposited over the wiring or contact structures 28a and 28b. The dielectric layer 34 can be oxide, for example; although other dielectric materials are also contemplated by the present invention such as, for example, $SiO_2$, FSG, SiCOH. The dielectric layer 34 can be polished using conventional processes such as, for example, CMP.

Figure 6:
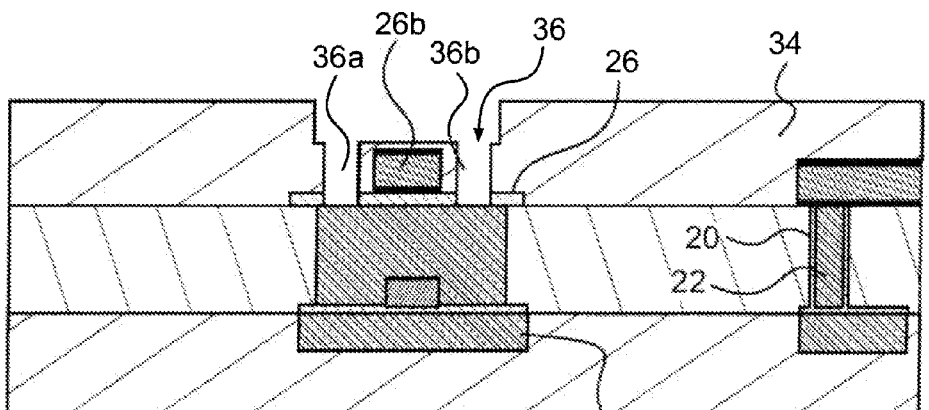

In FIG. 6, a dual damascene process is performed to form a dual damascene trench 36 in the dielectric layer 34. The dual damascene trench 34 extends to the metal (e.g., copper) 24, by the formation of two vias 24a and 34b. The vias 24a and 24b extend through the metal 26 and surround the contact or wire 28b. In embodiments, the etch rate of the dual damascene process can be modified to adjust the thickness of the dielectric layer (oxide) over the contact or wire (switch) 28b. In this way, the thickness of the dielectric layer (oxide) can be adjusted to modify switch performance.

Figure 7:
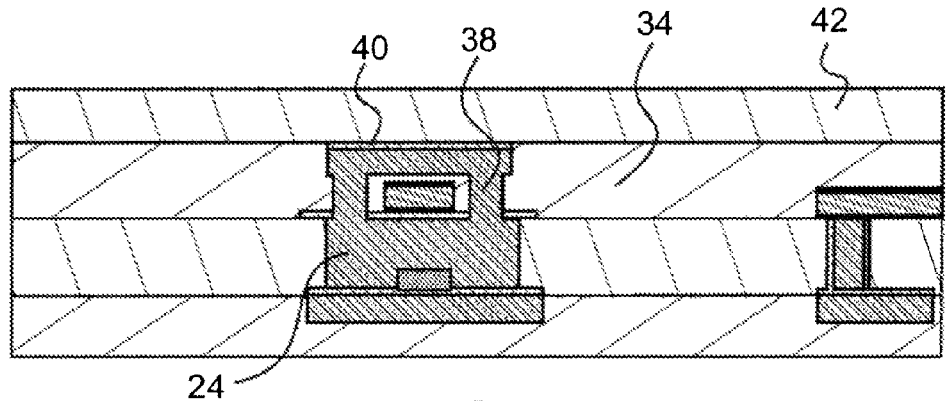

In FIG. 7, the dual damascene trench (including the vias) is filled with a metal such as, for example, copper 38. The copper 38 is formed in contact with the metal (e.g., copper) 24. In embodiments, the copper 38 is planarized using conventional fabrication processes such as, for example, CMP. In embodiments, the copper 38 is a sacrificial wiring layer, which is removed in later processing steps. A selective cap 40 is deposited on the copper 38. In embodiments, the cap 40 is CoWP. A dielectric material 42 is deposited on the structure using conventional deposition methods as discussed herein.

Figure 8:
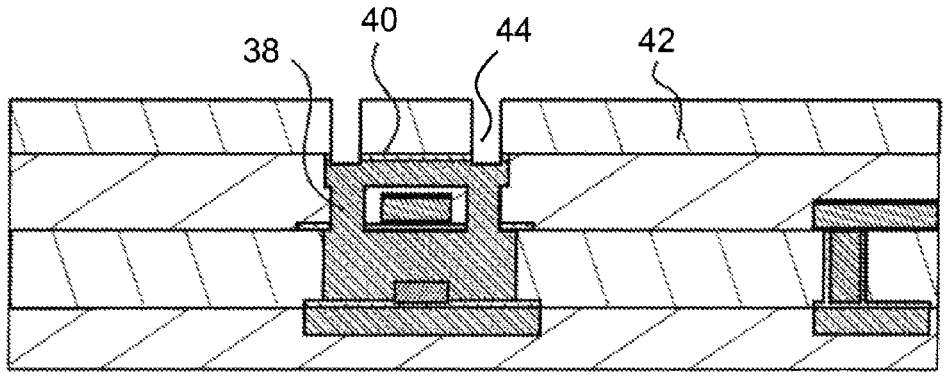

As shown in FIG. 8, vent holes 44 are formed in the dielectric material 42, extending to and exposing the copper 38. The vent holes 44 are formed by an oxide etch and a CoWP etch, for example, using conventional lithographic and etching processes. That is, the vent holes 44 are etched into the dielectric material 42 and through the selective cap 40. This provides access to the copper layers 24 and 38, and other metal and/or capping layers 26.

Figure 9:
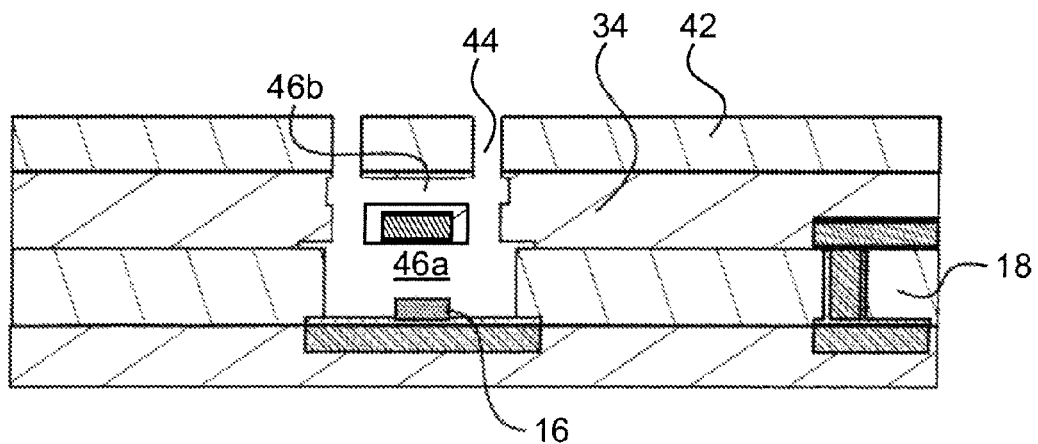

In FIG. 9, etching processes are performed to form planar cavities 46a and 46b. For example, in embodiments, a wet etch removal of the copper layers 24 and 38 (and layer 26) is performed to form the planar cavities 46a and 46b. A dry etch can also be performed to remove Si, for example.

Figure 10:
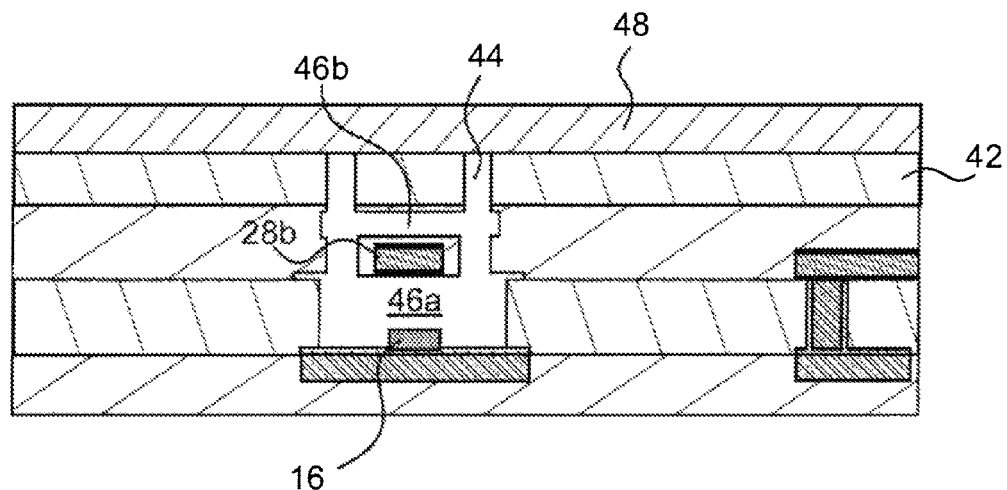

The vent holes 44 are then capped or closed by the deposition of a cap layer 48, as shown in FIG. 10. The cap layer 48 hermetically seals the planar cavities 46a and 46b. The cap layer 48 can be, for example, an oxide or nitride material. In this way, the wiring 28b is suspended, and forms a moving lever or arm that can be driven to contact a lower wiring or contact 16.

Figure 11:
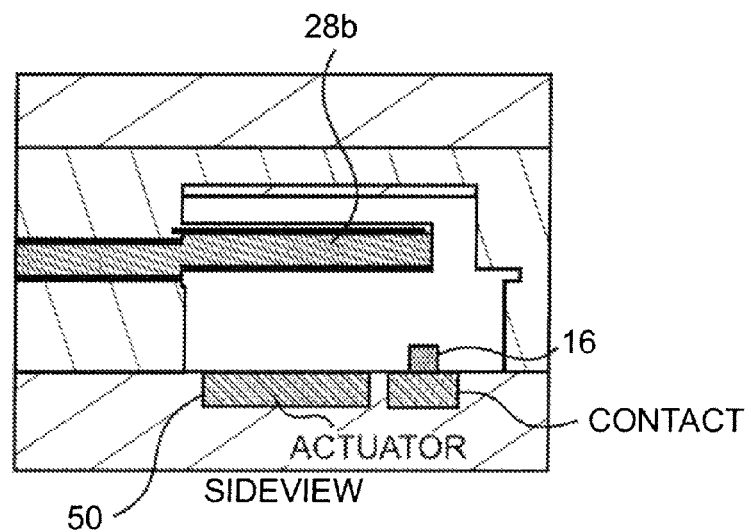

FIG. 11 shows a side view of the structure of FIG. 10. As shown in the side view, the wiring 28b is suspended and forms a moving lever that can be driven to contact a lower wiring or contact 16. The wiring 28b can be moved by providing a voltage to the actuator 50.

Figure 12:
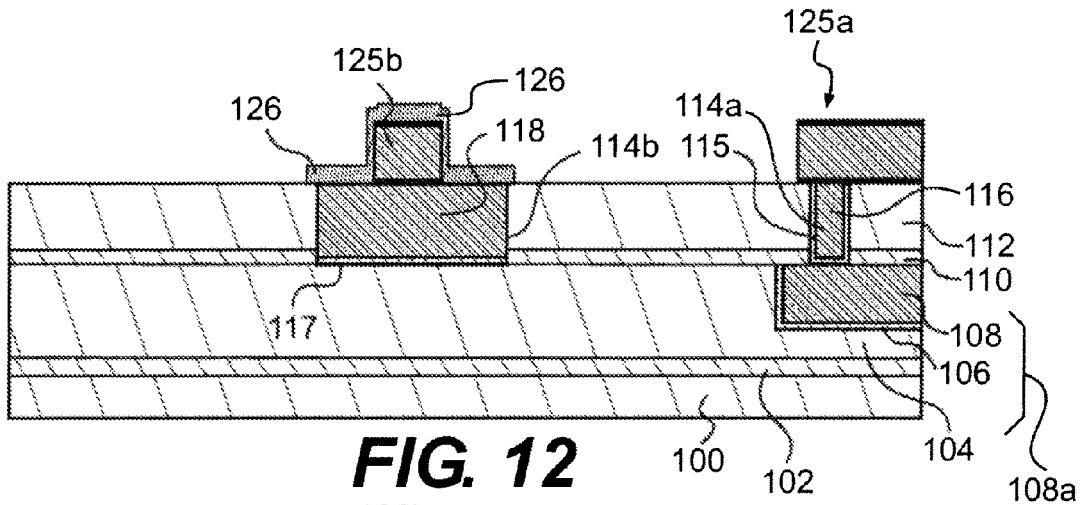
FIGS. 12-19 show structures and respective processing steps in accordance with additional aspects of the invention.

FIGS. 12-19 show structures and respective processing steps in accordance with additional aspects of the invention. More specifically, FIG. 12 shows a beginning structure at any desired level of a semiconductor device. The beginning structure includes a dielectric material 100. The dielectric material 100 may be, for example, $SiO_2$, FSG, SiCOH or other known dielectric materials. A cap layer 102 is deposited on the dielectric material 100. The cap layer 102 can be, for example, a SiN layer. In embodiments, the cap layer 102 can be deposited by conventional deposition methods as discussed herein.

A dielectric layer 104 is deposited on the cap layer 102, using conventional deposition methods, as discussed herein. In embodiments, the dielectric material 104 is patterned using conventional lithographic and etching processes, such as, for example, reactive ion etching. This patterning forms trenches which can be filled with a copper damascene wiring 108a, comprising a liner 106 and copper 108. In embodiments, the wiring 108a can be formed by electroplating. The wiring 108a can be, for example, about 1 micron tall and about 0.5 to 100 microns wide. The wiring 108a (and the dielectric material 104) can be polished (planarized) using conventional processes such as, for example, CMP.

Still referring to FIG. 12, a cap layer 110 is deposited directly on the wiring 108a and the dielectric material 104. The cap layer 110 can be, for example, SiN. A dielectric material 112 is deposited on the cap layer 110 using conventional deposition methods such as, for example, CVD. The dielectric material 112, as with all dielectric materials, may be, for example, oxide, $SiO_2$, FSG or SiCOH, to name a few types of materials. The dielectric material 112 undergoes an etching process to form openings for wiring 114a and 114b. Advantageously, the wiring 114a and 114b may be deposited (formed) at the same time.

Similar to the processes of FIG. 3, a liner 115 is deposited in the opening that forms the wiring 114a. The liner 115 can be, for example, a nitride material. In embodiments, the liner 115 may be about 40 nm; although other dimensions are also contemplated by the present invention. A metal 116 (e.g., copper) is deposited within the via. The metal deposition may begin with a copper seed layer and then a deposition or electroplating process, to fill the via. A lithographic and etching process is also used to open a via over the wiring 114b.

A liner 117 can be deposited in contact with the underlining dielectric material 104. A metal 118 (e.g., copper) is deposited within the via to form the wiring 114b. The metal deposition may begin with a copper seed layer and then a deposition or electroplating process (which may be the same process for any copper wiring layer), to fill the via. In embodiments, the metal for both wirings 114a and 114b may be deposited at the same time. Alternatively, the via over the wiring 114a may be formed prior to the via over the wiring 114b, or vice versa. After the formation of the metal, the structure can undergo a polishing process such as, for example, a chemical mechanical polishing (CMP). As will be discussed below, the wiring 114b is a sacrificial layer, which will be removed in later processes.

Wiring or contact structures 125a and 125b are formed using conventional deposition and etching processes. The wiring or contact structures 125a and 125b can be formed using, for example, a Ti/TiN/Al Cu/TiN stack, by deposition processes known to those of skill in the art. In embodiments, the wiring or contact structures 125a and 125b can include a gold upper layer for improved contact. Advantageously, wiring or contact structures 125a and 125b may be deposited at the same time.

In embodiments, a subtractive etch of the wiring can be used, in which the etch chemistry does not corrode Cu, to form the wiring or contact structures 125a and 125b. As should be understood by those of skill in the art, the wiring or contact structure 125b will act as a moving lever or arm in the switch. A metal cap 126 is formed over the contact structure 125b (switch). In embodiments, the metal is tungsten (W) which is sputter deposited and patterned to form the metal cap 126.

Figure 13:
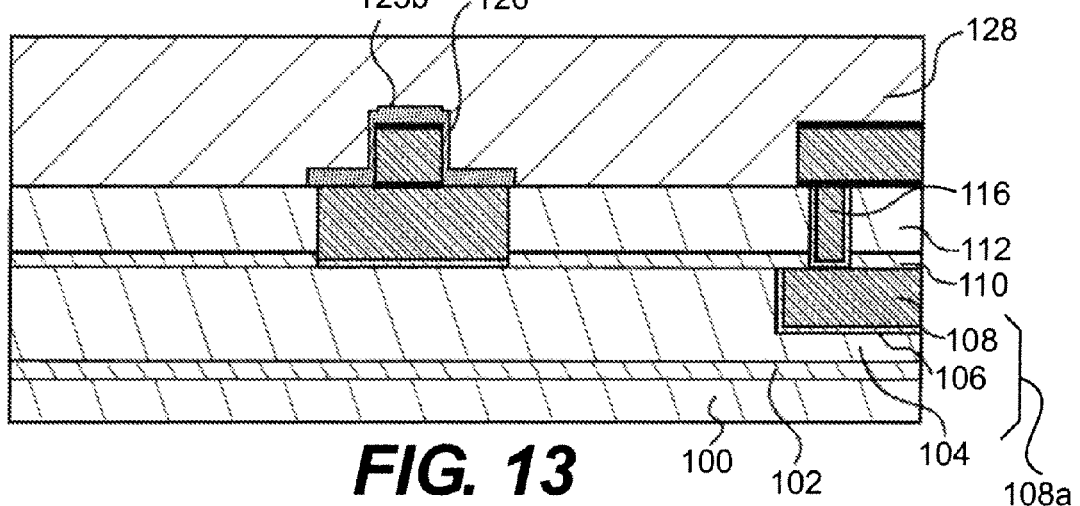

In FIG. 13, a dielectric layer 128 is deposited over the wiring or contact structures 125a and 125b. The dielectric layer 128 can be oxide, for example; although other dielectric materials are also contemplated by the present invention such as, for example, $SiO_2$, FSG, SiCOH. The dielectric layer 128 can be polished using conventional processes such as, for example, CMP.

Figure 14:
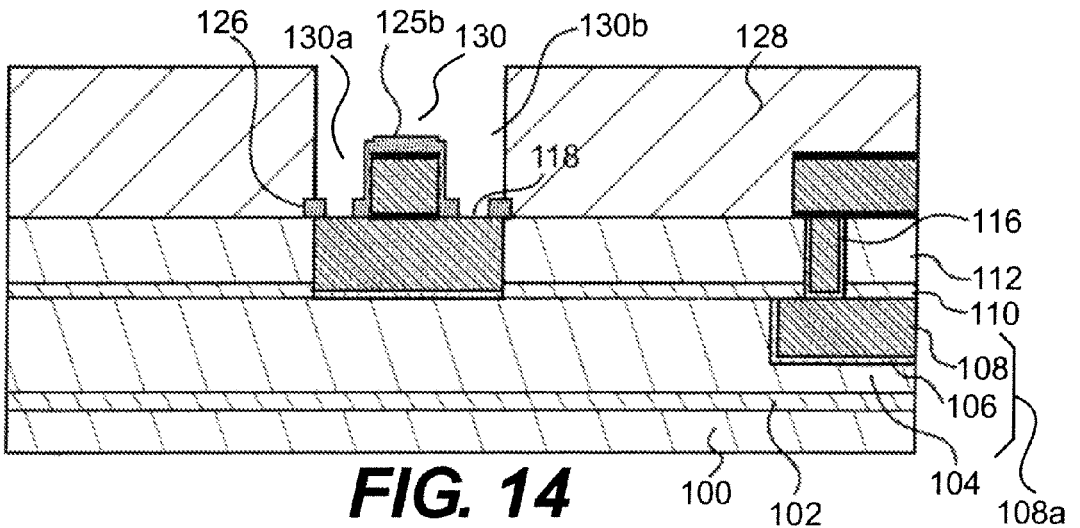

In FIG. 14, a dual damascene process is performed to form a dual damascene trench 130 in the dielectric layer 128. The dual damascene trench 130 extends to and exposes the metal (e.g., copper) 118, by the formation of two vias 130a and 130b. The vias 130a and 130b extend through and expose the metal 126 and surround the contact or wire 125b. In embodiments, the etch rate of the dual damascene process can be modified to adjust the thickness of the dielectric layer (oxide) over the contact or wire (switch) 125b. In this way, the thickness of the dielectric layer (oxide) can be adjusted to modify switch performance.

Figure 15:
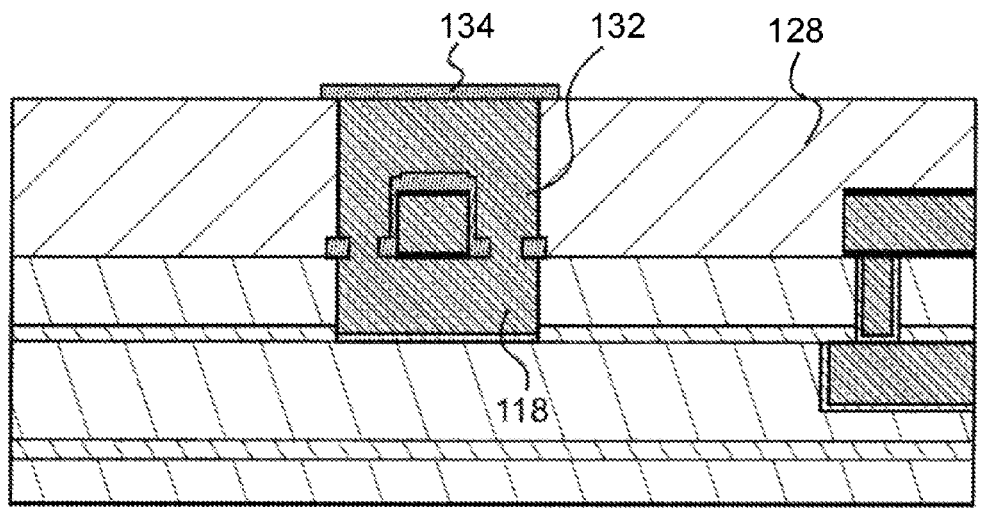

In FIG. 15, a metal (e.g., copper) 132 is deposited in the dual damascene trench 130, including the two vias 130a and 130b. In this way, the metal (e.g., copper) 132 is in direct contact with the metal (e.g., copper) 118. The dielectric material 128 and the metal 132 can then be planarized using conventional processes such as, for example, CMP. A metal layer 134 is deposited and patterned over the metal 132. The metal layer 134 can be, for example, tungsten. The deposition and patterning can be performed using conventional metal deposition and etching (patterning) processes.

Figure 16:
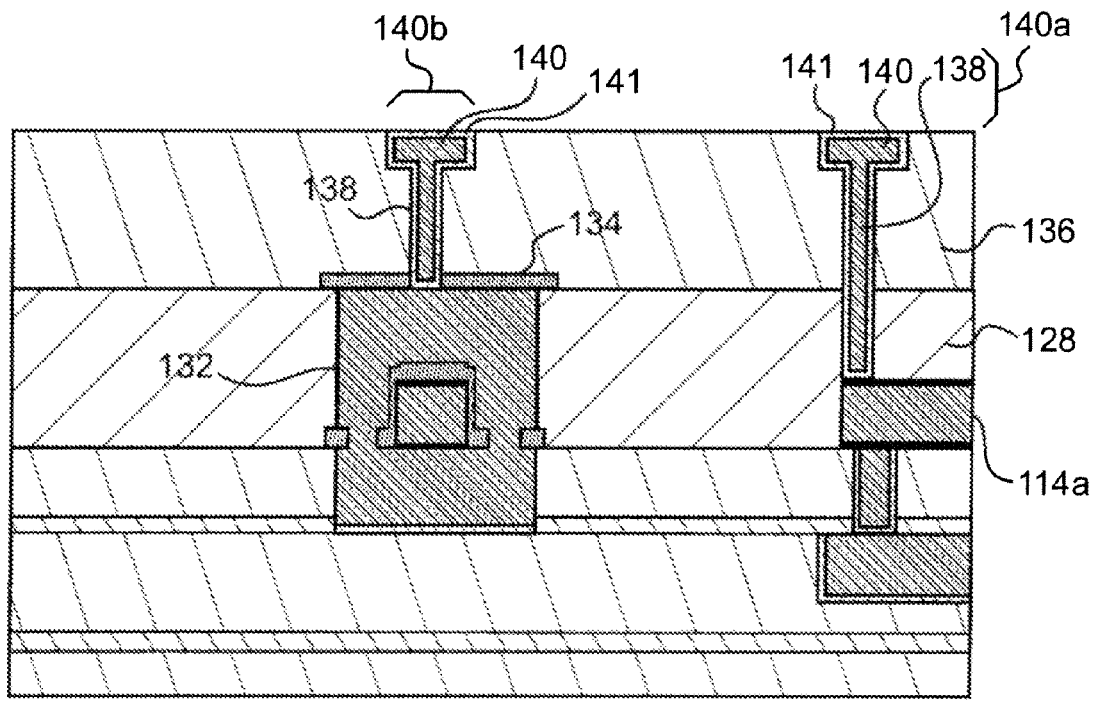

In FIG. 16, a dielectric material 136 is deposited on the metal layer 124 and the underlying dielectric material 128. By dual damascene processes, for example, wires 140a and 140b can be formed to be in contact with the underlying wire 114a and the metal (copper) 132, respectively. In embodiments, the dual damascene vias, used to form the wires 140a and 140b, can include a liner 138 such as, for example, nitride. Copper 140 can be deposited within the vias to form the wires 140a and 140b. Advantageously, the wires 140a and 140b can be formed at the same time. The wires can also be capped with a nitride cap 141. The structure, e.g., nitride cap 141 and dielectric material 136, can then be planarized using conventional processes such as, for example, a CMP.

Figure 17:
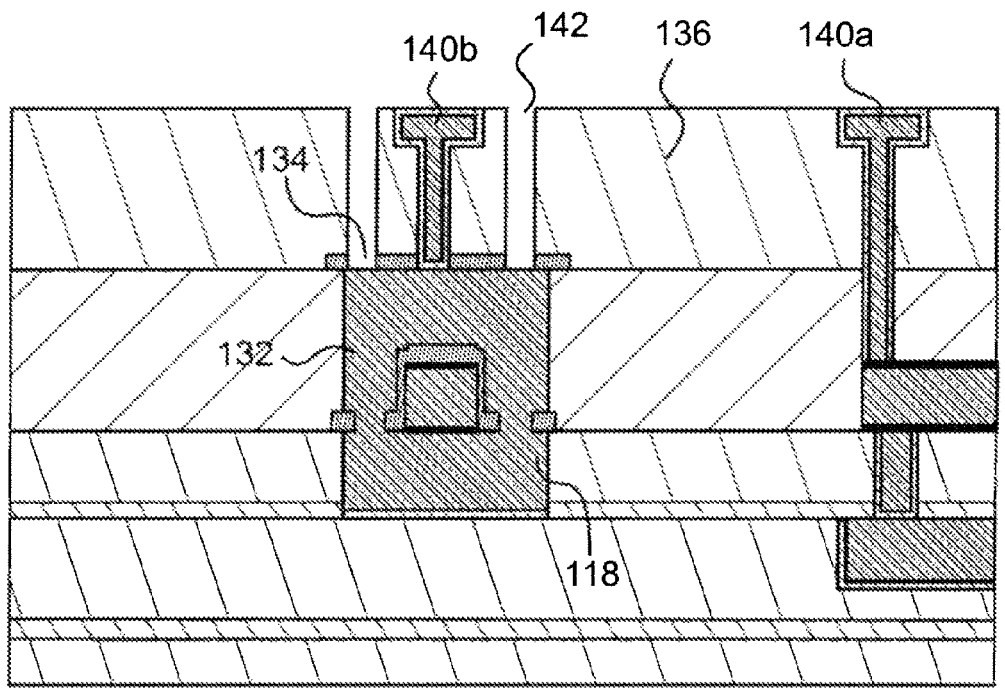

In FIG. 17, vent holes 142 are formed in the dielectric material 136, extending to and exposing the copper 132. The vent holes 142 are formed by an oxide etch and a CoWP etch, for example, using conventional lithographic and etching processes. That is, the vent holes 142 are etched into the dielectric material 132 and through the cap 134. This provides access to the copper layers 118 and 132 (and other metal and/or capping layers 126, 134).

Figure 18:
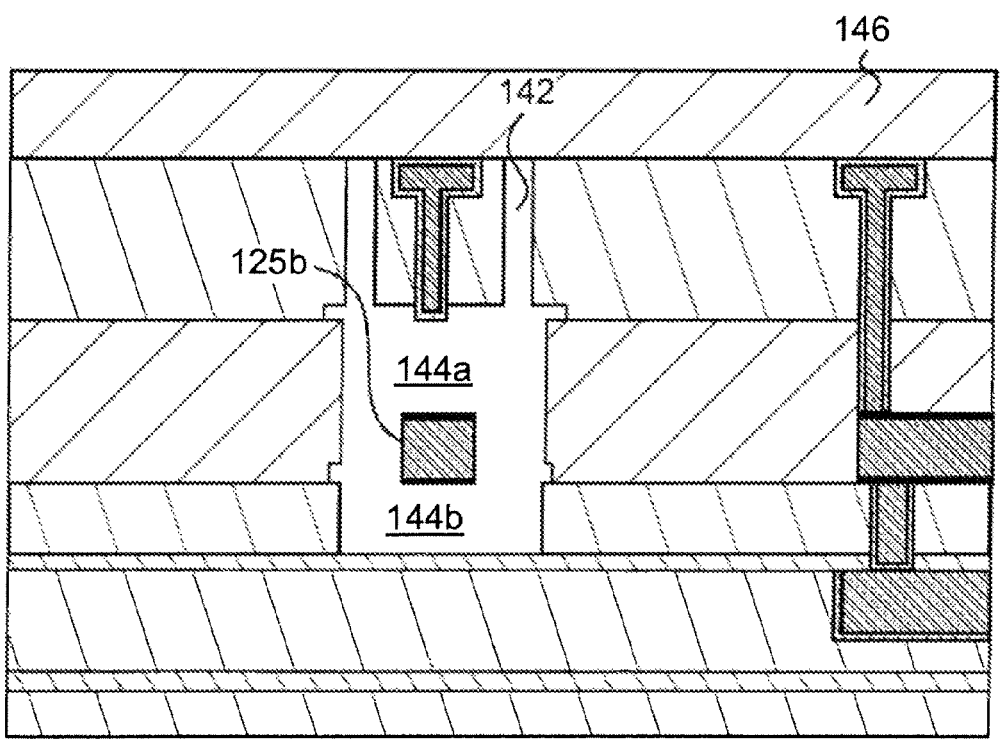

FIG. 18 shows etching processes to form planar cavities 144a and 144b. For example, in embodiments, a wet etch removal of the copper layers 118 and 132 (and other metal and/or capping layers 126, 134) is performed to form the planar cavities 144a and 144b. A dry etch can also be performed to remove Si, for example. The vent holes 142 are capped or closed by the deposition of a cap layer 146. The cap layer 146 can be, for example, an oxide or nitride material. The cap layer 146 hermetically seals the planar cavities 144a and 144b. In this way, the wiring 125b is suspended, and forms a moving lever that can be driven to contact an upper wiring or contact 140b.

Figure 19:
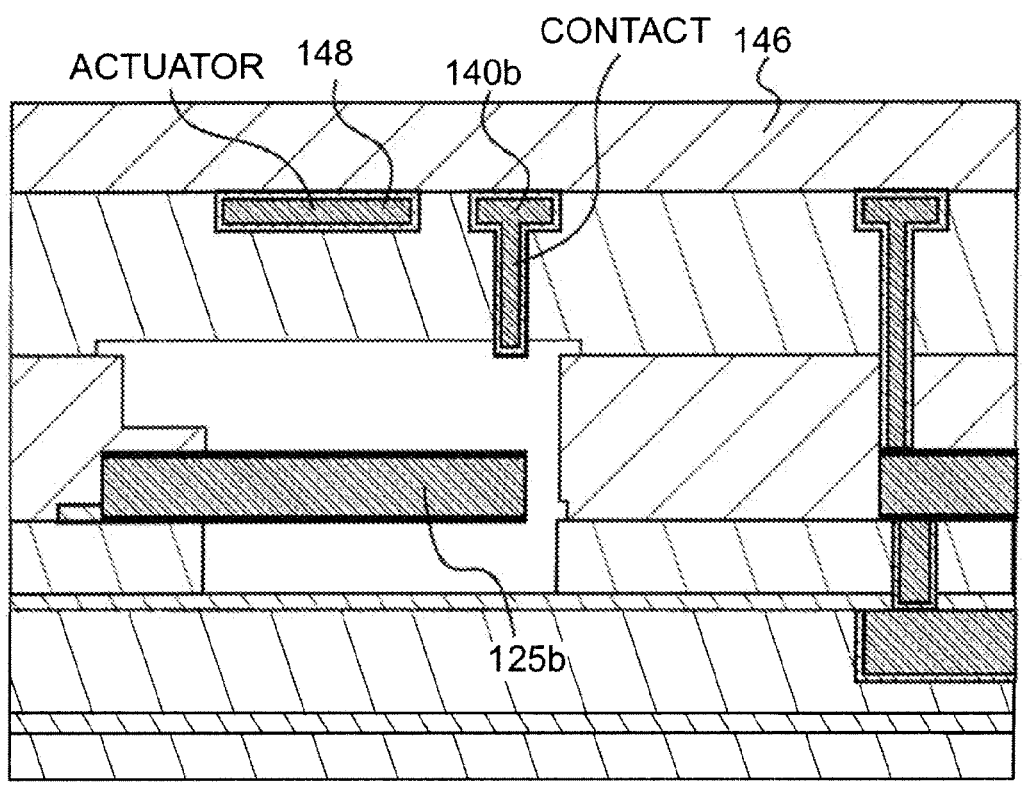

FIG. 19 shows a side view of the structure of FIG. 18. As shown in the side view, the wiring 125b is suspended and forms a moving lever that can be driven to contact an upper wiring or contact 140b. The wiring 125b can be moved by providing a voltage to the actuator 148. The upper wiring or contact 140 band the actuator 148 can be formed in the same dielectric layer, and the upper wiring or contact 140 band the actuator 148 can be formed by deposition of copper at a same time.

Figure 20:
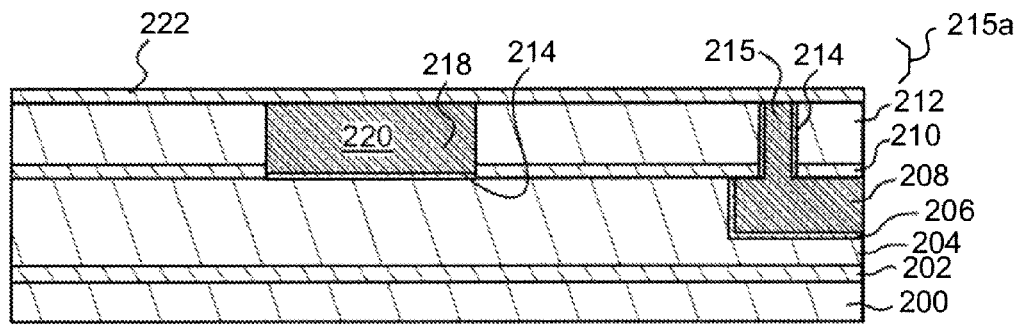
FIGS. 20-26 show structures and respective processing steps in accordance with further aspects of the invention.

FIGS. 20-26 show structures and respective processing steps in accordance with additional aspects of the invention. More specifically, FIG. 20 shows a beginning structure at any desired level of a semiconductor device. The beginning structure includes a dielectric material 200. The dielectric material 200 may be, for example, $SiO_2$, FSG, SiCOH or other known dielectric materials. A cap layer 202 is deposited on the dielectric material 200. The cap layer 202 can be, for example, a SiN layer. In embodiments, the cap layer 202 can be deposited by conventional deposition methods as discussed herein. A dielectric layer 204 is deposited on the cap layer 202, using conventional deposition methods, as discussed herein.

In embodiments, the dielectric material 204 is patterned using conventional lithographic and etching processes, such as, for example, reactive ion etching. This patterning forms trenches which can be filled with a copper damascene wiring 208, comprising a liner 206. In embodiments, the wiring 208 can be formed by electroplating. The wiring 208 can be, for example, about 1 micron tall and about 0.5 to 100 microns wide. The wiring 208 (and the dielectric material 204) can be polished (planarized) using conventional processes such as, for example, CMP.

Still referring to FIG. 20, a cap layer 210 is deposited directly on the wiring 208 and the dielectric material 204. The cap layer 210 can be, for example, SiN. A dielectric material 212 is deposited on the cap layer 210 using conventional deposition methods such as, for example, CVD. The dielectric material 212, as with all dielectric materials, may be, for example, oxide, $SiO_2$, FSG or SiCOH, to name a few types of materials. The dielectric material 212 undergoes an etching process to form openings for copper wiring 215 and 218, similar to the processes of FIG. 3. Advantageously, the copper wiring 215 and 218 can be formed at the same time.

A liner 214 is deposited in the opening that forms the wiring 215. The liner 214 can be, for example, a nitride material. In embodiments, the liner 214 may be about 40 nm; although other dimensions are also contemplated by the present invention. The liner 214 can also be deposited in contact with the underlying dielectric layer 204, and in contact with the copper wiring 218. A metal (e.g., copper) is deposited within the via. A cap layer 222 is then deposited on the metal and the dielectric layer 212.

Figure 21:
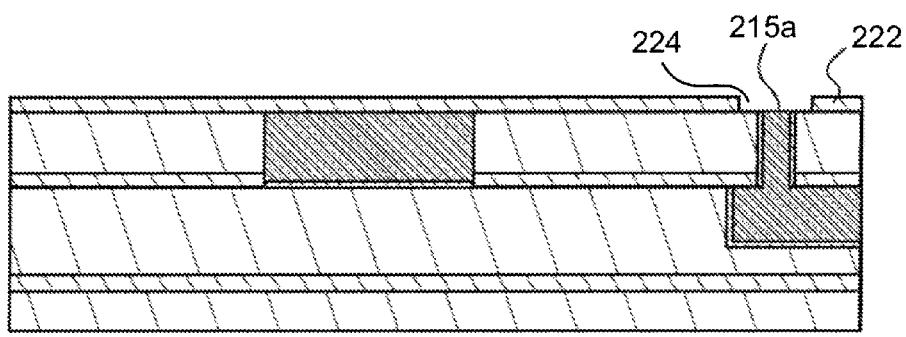
Figure 22:
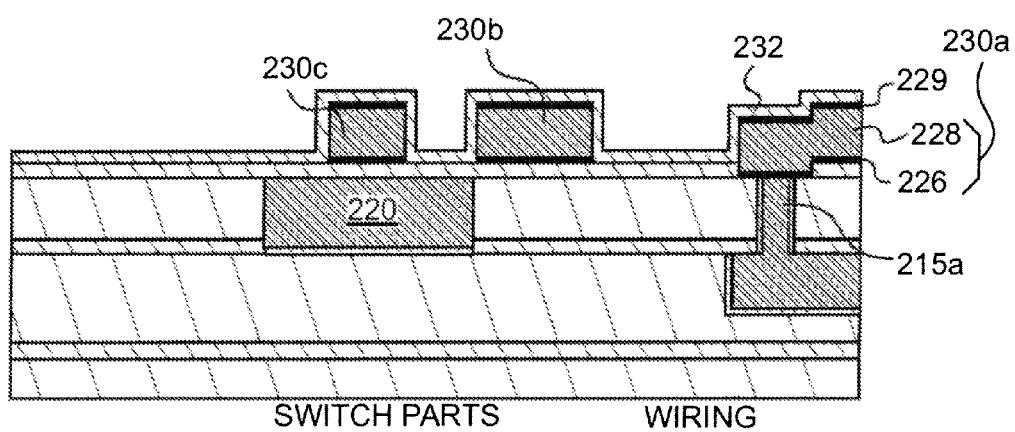

In FIG. 21, an opening 224 is formed in the cap layer 222, to wiring 215a. In FIG. 22, wiring or contact structures 230a, 230b and 230c are formed simultaneously using the deposition and etching processes as discussed herein. The wiring or contact structures 230a, 230b and 230c can include a wiring stack 226, 228, 229, such as, for example, Ti/TiN/Al Cu/TiN stack. In embodiments, the wiring or contact structures 230a, 230b and 230c can include a gold upper layer for improved contact. In embodiments, a subtractive etch of the wiring can be used, in which the etch chemistry does not corrode Cu, to form the wiring or contact structures 230a, 230b and 230c. The wiring or contact structure 230a is in direct contact with the metal (e.g., copper) 215a. A conformal capping material 232 such as, for example, SiN is deposited over the wiring or contact structures 230a, 230b and 230c.

Figure 23:
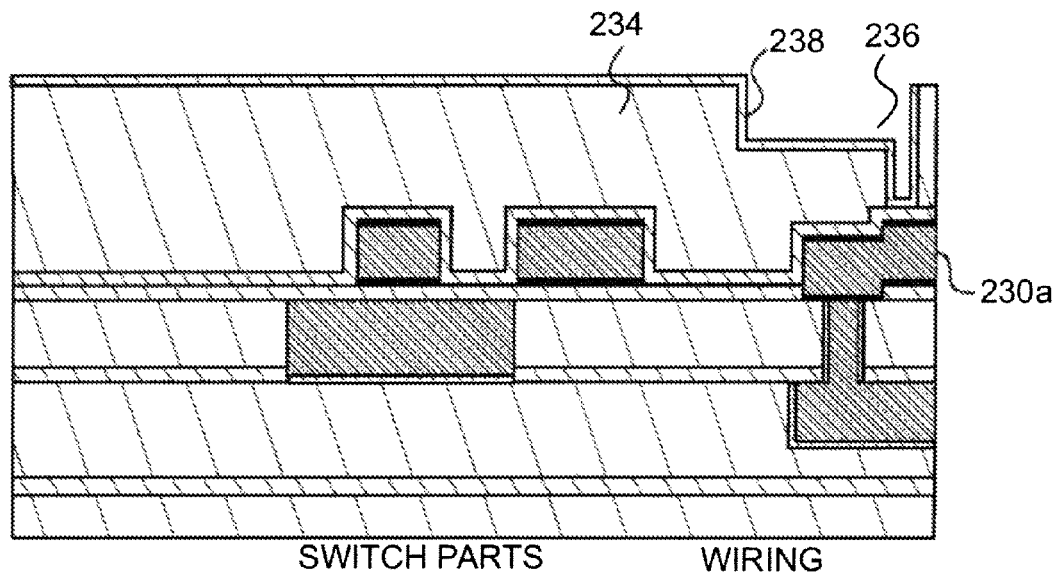

In FIG. 23, a dielectric material 234 is deposited on the capping material 232. A dual damascene process is used to form the trench 236. The trench 236 opens to and exposes the wiring 230a. A liner material 238 is deposited on the dielectric material 234 and within the trench 236, making contact with the wiring 230a.

Figure 24:
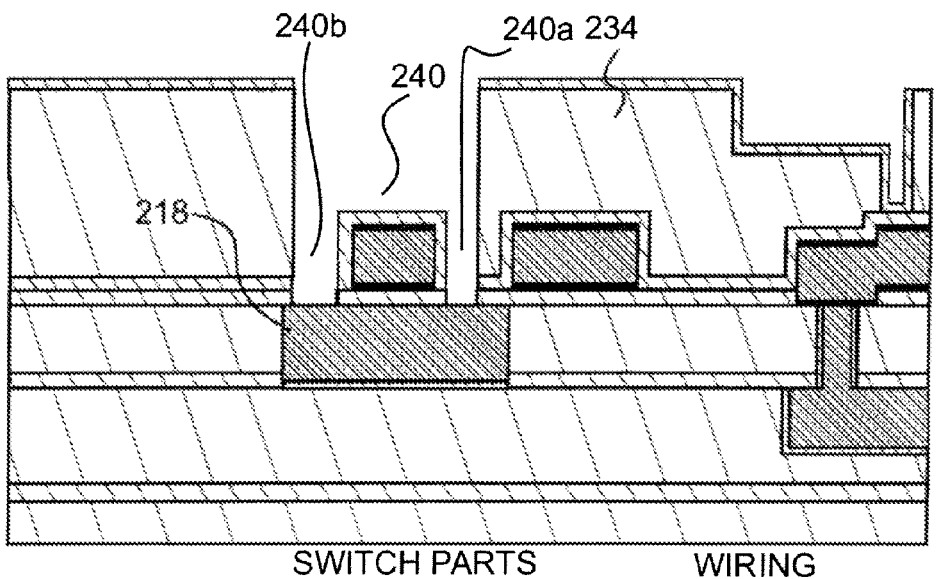

As shown in FIG. 24, a dual damascene process is used to form trench 240 with vias 240a and 240b. The vias 240a, 240b reach down and expose the copper wire 218. In embodiments, the etch rate of the dual damascene process can be modified to adjust the thickness of the dielectric layer (oxide) over the contact or wire (switch) 218. In this way, the thickness of the dielectric layer (oxide) can be adjusted to modify switch performance.

Figure 25:
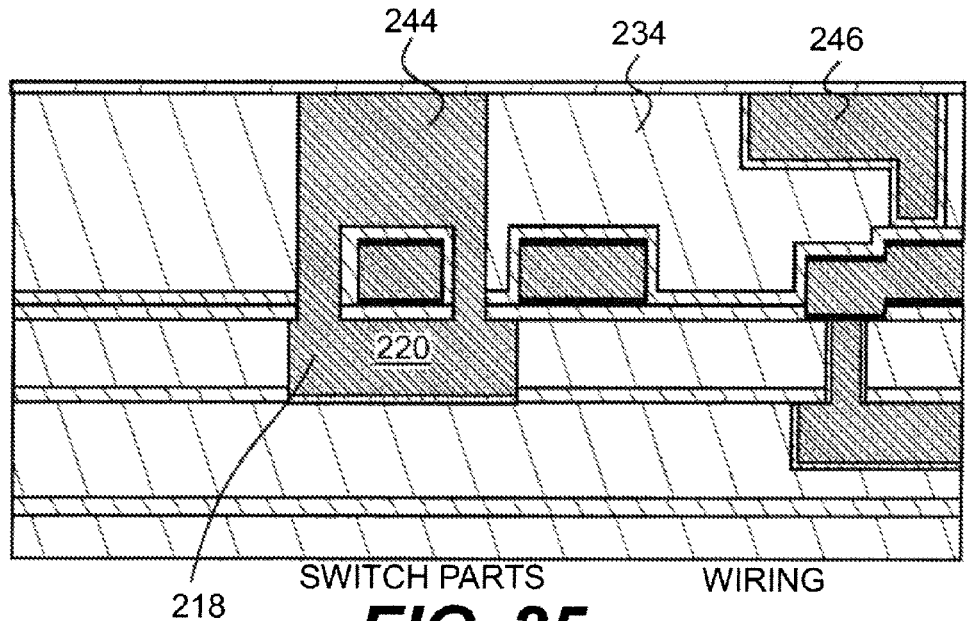

In FIG. 25, copper 244 is deposited in the trench 240 and vias 240a, 240b to make contact with the underlying copper 218. Copper can also be deposited in the trench 236 to form the wiring 246. The copper 244 and 218 are sacrificial copper layers, which are removed in later processing steps. Advantageously, the copper wiring 244 and 246 can be formed at the same time.

Figure 26:
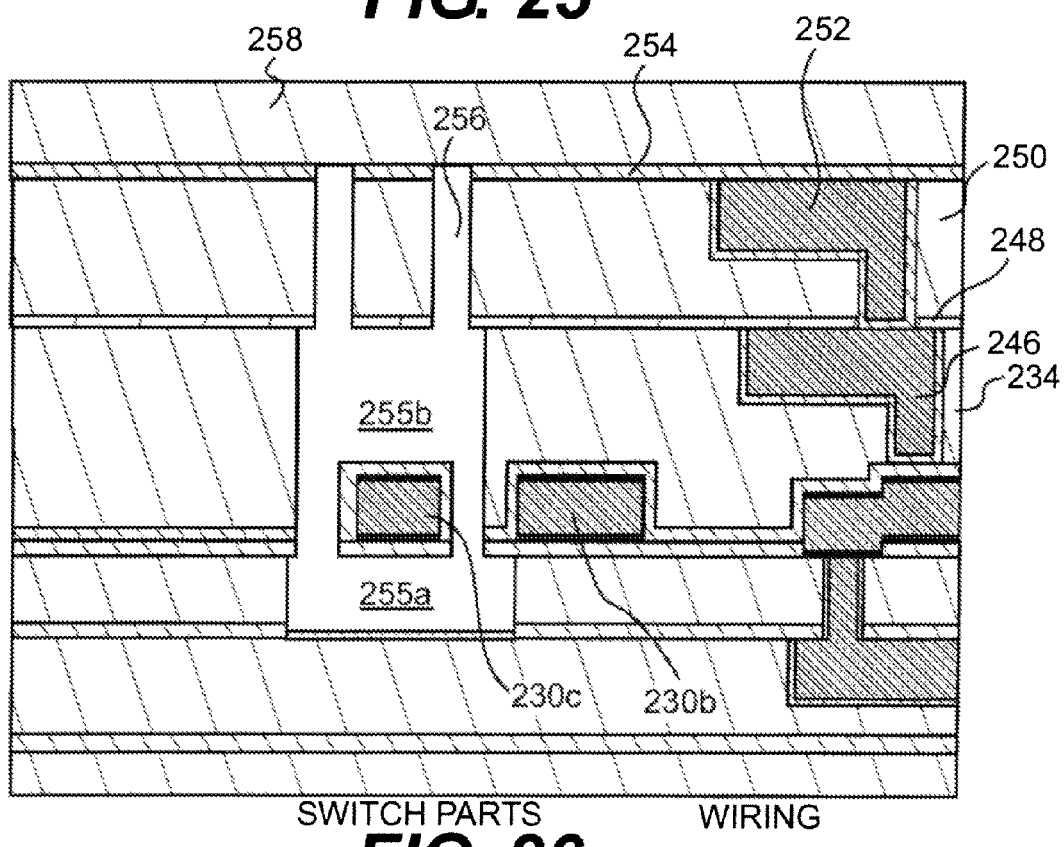

In FIG. 26, a capping material 248 is deposited on the dielectric material 234 and copper wire 246 and copper 246 (not shown). The capping layer 248 may be, for example, SiN. A dielectric material 250 is deposited on the capping layer 248. In embodiments, the dielectric material 250 is oxide, although other dielectric materials are contemplated for use by the present invention (as discussed herein). A dual damascene wire 252 is then formed in a trench of the dielectric material using conventional processes as discussed herein. The trench can be lined with a nitride, for example, prior to the deposition of the wiring material (e.g., copper). The structure is then capped with a capping material 254 such as SiN material, for example.

As further shown in FIG. 26, vent holes 256 are formed in the dielectric material 250, extending to and exposing the copper 218 (not shown). The vent holes 256 are formed by an oxide etch and a CoWP etch, for example, using conventional lithographic and etching processes. That is, the vent holes 256 are etched into the dielectric material 250 and through the selective cap 248. This provides access to the copper layers 218 and 244.

In embodiments, etching processes are performed to form planar cavities 255a and 255b. For example, in embodiments, a wet etch removal of the copper layers 218 and 244 is performed to form the planar cavities 255a and 255b. A dry etch can also be performed to remove Si, for example. The vent holes 256 are capped or closed by the deposition of a cap layer 258, as shown in FIG. 26. The cap layer 258 can be, for example, an oxide material. The cap layer 258 hermetically seals the planar cavities 255a and 255b. In this way, the wiring 230c is suspended, and forms a moving lever that can be driven sideways to contact the wiring or contact 230b.

Figure 27:
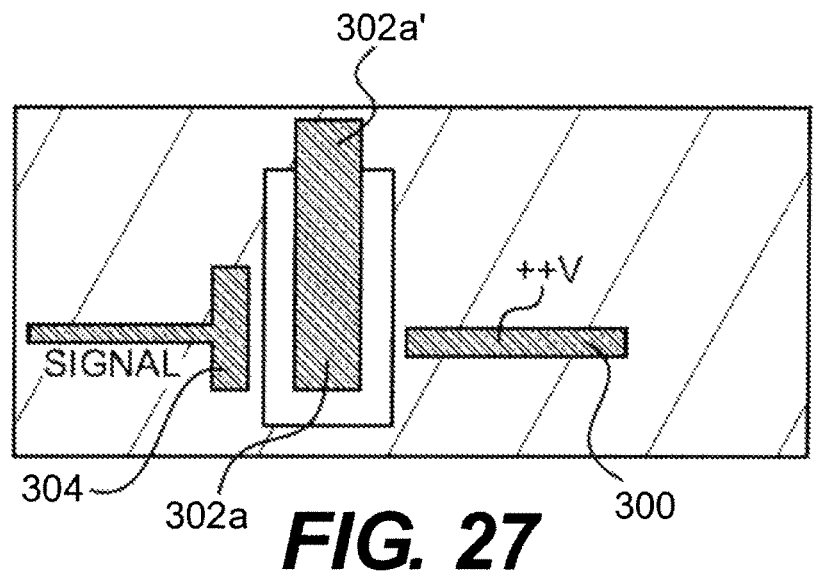
FIGS. 27 and 28 show top views of capacitive contact switches in accordance with aspects of the invention.
Figure 28:
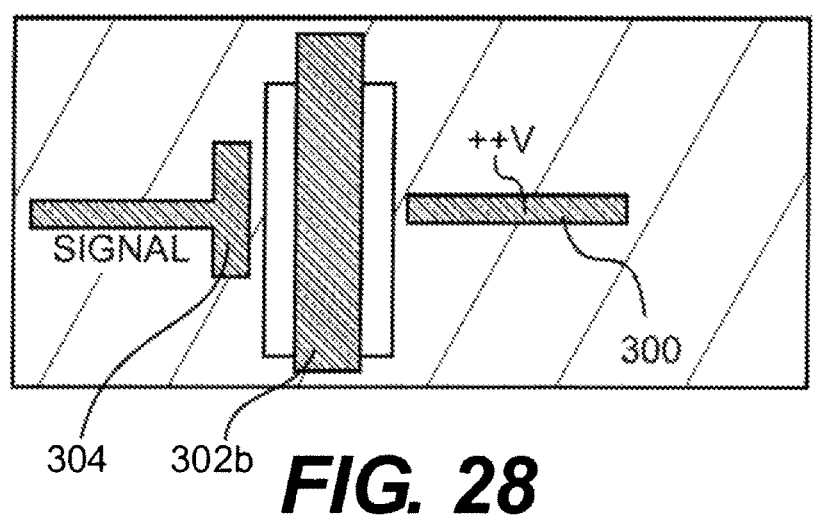

FIGS. 27 and 28 show top views of switches in accordance with aspects of the invention. In embodiments, FIGS. 27 and 28 show side capacitance switches which are fabricated in accordance with aspects of the invention. In the embodiment of FIG. 27, a lever 302a is anchored at one end 302a', and is provided between an actuator 300 and a signal line 304. In the embodiment of FIG. 28, a lever 302b is anchored at both ends 302b', and is provided between an actuator 300 and a signal line 304. Upon actuation (e.g., application of a voltage, ++V) of the actuator 300, the lever 302a will be drawn (move) towards the actuator 304, changing the capacitance value between the lever 302a and the signal line 304. Similarly, upon actuation (e.g., application of a voltage, ++V) of the actuator 300, the lever 302b will bend (move) towards the actuator 304, changing the capacitance value between the lever 302a and the signal line 304. In both scenarios, this change in capacitance will be a provided as a signal through the signal line 304.

Figure 29:
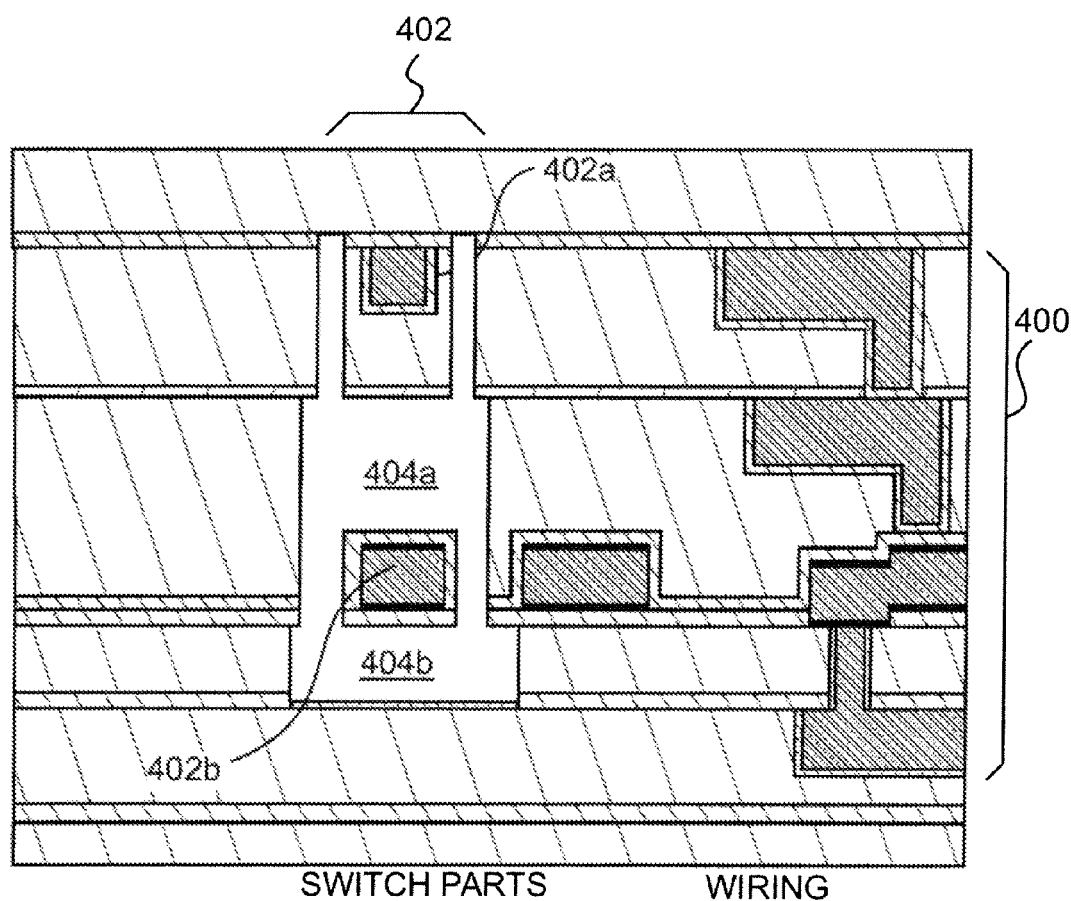
FIG. 29 shows a structure and respective processing steps in accordance with yet a further aspect of the invention.

FIG. 29 is another aspect of the present invention. In this aspect of the invention, a top contact capacitive switch is shown. More specifically, using the fabrication processes described herein, wiring layers 400 are formed on one side of the structure, whereas, the capacitive contact switch 402 is formed on another side of the structure (within multiple dielectric layers). The capacitive contact switch 402 includes an upper actuator 402a and a lower wiring or contact structure (lever) 402 that is formed within an upper and lower cavity 404a and 404b. In this embodiment, the lower wiring or contact structure (lever) 402 can move or bend towards the upper actuator 402am upon an application of voltage.

Figure 30:
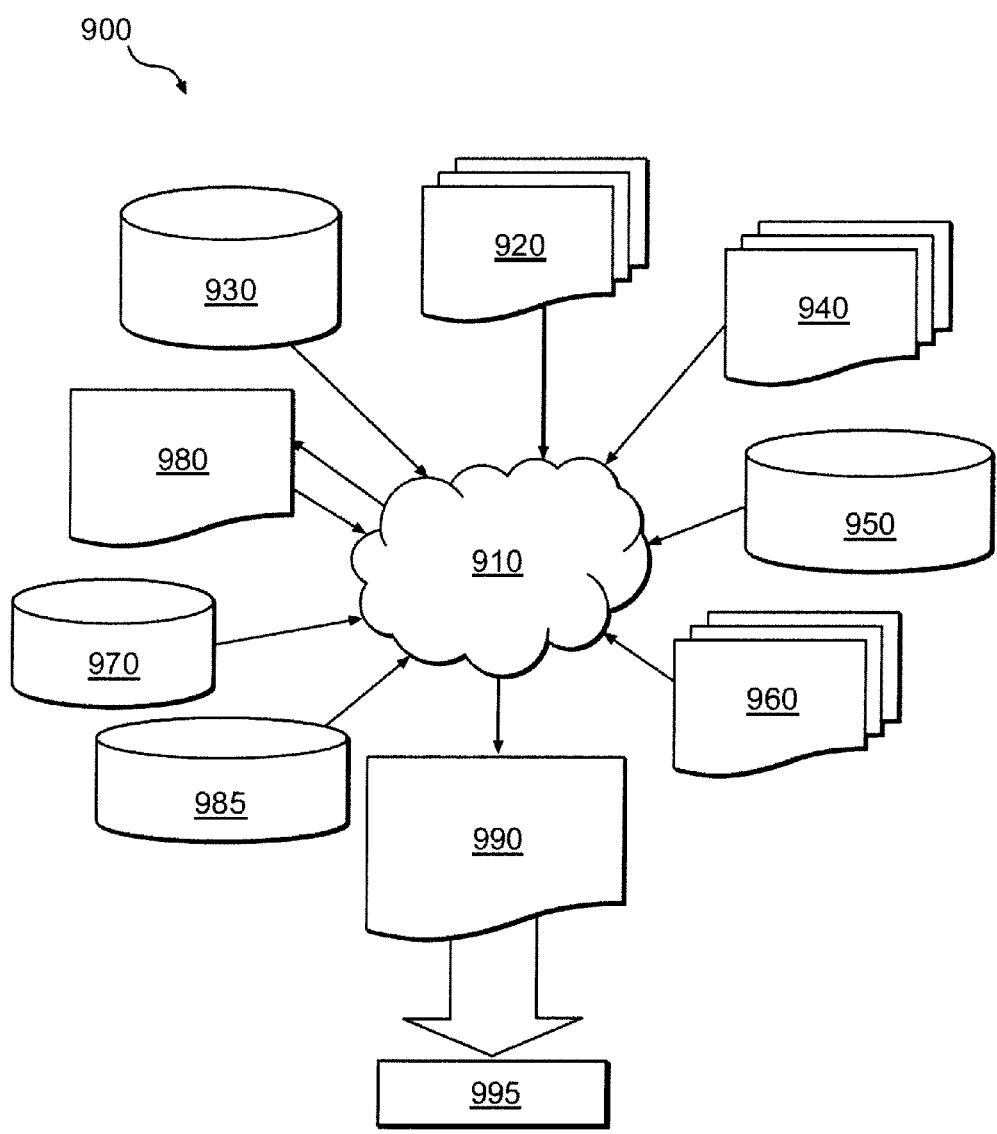
FIG. 30 is a flow diagram of a design process used in semiconductor design, manufacture, and/or test.

FIG. 30 is a flow diagram of a design process used in semiconductor design, manufacture, and/or test. FIG. 30 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-29. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 30 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-29. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-29 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-29. In one embodiment, design structure 990 may comprise a compiled, executable HDL simulation model that functionally simulates the devices shown in FIGS. 1-29.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-29. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
    forming a sacrificial metal layer at a same level as a wiring layer, in a first dielectric material;
    forming a metal switch at a same level as another wiring layer, in a second dielectric material;
    providing at least one vent to expose the sacrificial metal layer;
    removing the sacrificial metal layer to form a planar cavity, suspending the metal switch;
    capping the at least one vent to hermetically seal the planar cavity;
    forming a dual damascene trench and vias within the second dielectric material, surrounding the metal switch, and extending to the sacrificial metal layer;

forming an upper sacrificial metal layer within the dual damascene trench and vias, which is in direct contact with the sacrificial metal;

forming a third dielectric material over the upper sacrificial metal, wherein:
the at least one vent hole is formed in the third dielectric material and exposes the upper sacrificial metal;
the removing includes removing the upper sacrificial metal which forms an upper planar cavity; and
the removing the sacrificial metal forms a lower planar cavity, extending to the upper planar cavity.

2. The method of claim 1, wherein the sacrificial metal layer is formed over a contact and the contact is formed in the planar cavity, over a lower metal wiring layer.

3. The method of claim 1, wherein the sacrificial metal layer, wiring layer, metal switch and the another wiring layer are copper based metals.

4. The method of claim 1, wherein the cavity includes an upper planar cavity and a lower planar cavity, formed by venting sacrificial copper.

5. The method of claim 1, wherein the metal switch is suspended from one end in the second dielectric material, between the upper planar cavity and the lower planar cavity.

6. The method of claim 1, wherein the metal switch is suspended from both ends in the second dielectric material, between the upper planar cavity and the lower planar cavity.

7. The method of claim 1, wherein the dual damascene trench is adjusted to provide a thickness of the second dielectric material over the metal switch.

8. The method of claim 1, further comprising forming an actuator on a same level as the metal switch.

9. The method of claim 8, wherein the actuator and the metal switch are formed at the same time with the same materials.

10. The method of claim 9, further comprising forming sacrificial metal material above the metal switch, wherein the providing the at least one vent hole exposes the sacrificial metal material above the metal switch, and the removing includes removing the sacrificial metal material above the metal switch and the sacrificial metal to form an upper and a lower planar cavity, in which the metal switch is suspended therebetween.

11. A method, comprising:
forming a sacrificial metal layer at a same level as a wiring layer, in a first dielectric material;
forming a metal switch at a same level as another wiring layer, in a second dielectric material;
providing at least one vent to expose the sacrificial metal layer;
removing the sacrificial metal layer to form a planar cavity, suspending the metal switch;
capping the at least one vent to hermetically seal the planar cavity; and
forming a dual damascene contact in an upper dielectric layer, which is in contact with an upper sacrificial metal layer formed above the sacrificial metal layer.

12. The method of claim 11, wherein the contact is formed at a same time as another wiring.

13. The method of claim 11, wherein the at least one vent exposes the upper sacrificial metal layer, and is provided on a side of the contact and the removing removes the sacrificial metal layer and the upper sacrificial layer to form an upper planar cavity and a lower planar cavity.

14. The method of claim 11, further forming an actuator in a same dielectric layer as the contact, the actuator and the contact formed by deposition of copper at a same time.

15. A method, comprising:
forming a sacrificial copper based layer and a copper based wiring layer during a same processing, in a first dielectric material;
forming a metal stack switch and another wiring layer composed of the same materials as the metal stack switch during a same processing, in an upper dielectric material;
providing a dual damascene trench and depositing an upper sacrificial copper based layer in a same level as a further wiring layer, and composed of the same materials and deposited at a same processing;
forming at least one vent to expose the upper sacrificial copper based layer;
removing the upper sacrificial copper based layer and the sacrificial copper based layer to form an upper planar cavity and a lower planar cavity, which exposes the metal switch; and
capping the at least one vent to hermetically seal the upper planar cavity and the lower planar cavity.

16. The method of claim 15, further comprising forming a contact above the metal switch.

17. The method of claim 15, further comprising forming a contact below the metal switch.

18. The method of claim 15, further comprising forming an actuator at a same level as the metal switch.

* * * * *